(12) United States Patent
Klein et al.

(10) Patent No.: US 10,385,424 B2
(45) Date of Patent: Aug. 20, 2019

(54) PALLADIUM-BASED ALLOYS

(71) Applicant: Deringer-Ney, Inc., Bloomfield, CT (US)

(72) Inventors: Arthur S. Klein, Orange, CT (US); Edward F. Smith, III, Madison, CT (US); Srinath Viswanathan, West Hartford, CT (US)

(73) Assignee: Deringer-Ney, Inc., Bloomfield, CT (US)

( * ) Notice: Subject to any disclaimer, the term of this patent is extended or adjusted under 35 U.S.C. 154(b) by 703 days.

(21) Appl. No.: 15/010,690

(22) Filed: Jan. 29, 2016

(65) Prior Publication Data

US 2017/0218481 A1    Aug. 3, 2017

(51) Int. Cl.
*C22C 5/04*    (2006.01)
*G01R 1/067*   (2006.01)

(52) U.S. Cl.
CPC ............ *C22C 5/04* (2013.01); *G01R 1/06755* (2013.01)

(58) Field of Classification Search
CPC .............................. C22C 5/04; G01R 1/06755
See application file for complete search history.

(56) References Cited

U.S. PATENT DOCUMENTS

| | | | |
|---|---|---|---|
| 1,913,423 A * | 6/1933 | Wise | C22C 5/00 148/419 |
| 4,539,177 A | 9/1985 | Prasad | |
| 5,484,569 A | 1/1996 | Klein et al. | |
| 5,833,774 A | 11/1998 | Klein et al. | |
| 6,210,636 B1 | 4/2001 | Klein | |
| 7,354,488 B2 | 4/2008 | Klein et al. | |
| 2014/0377129 A1 * | 12/2014 | Shishino | C22C 30/02 420/587 |
| 2015/0197834 A1 | 7/2015 | Kumita et al. | |

FOREIGN PATENT DOCUMENTS

| | | | | |
|---|---|---|---|---|
| GB | 354216 A * | 7/1931 | | C22C 5/00 |
| JP | S52-47516 | 4/1977 | | |
| JP | S5247516 B2 * | 12/1977 | | B01J 43/00 |
| JP | 2011-122194 A | 6/2011 | | |

(Continued)

OTHER PUBLICATIONS

"New Generation of Probe Alloys", Smith, et.al., IEEE SW Test Workshop, Jun. 2013.

(Continued)

*Primary Examiner* — Jenny R Wu
(74) *Attorney, Agent, or Firm* — Dorsey & Whitney LLP

(57) ABSTRACT

Palladium-based ternary or higher alloys include palladium at about 45-55 wt %, copper about 32-42 wt %, silver at about 8-15 wt %, rhenium at about 0-5 wt %, and optionally one or more modifying elements at up to 1.0 wt %. The alloys are age-hardenable, provide hardness in excess of 350 HK (Knoop, 100 g load), have electrical conductivities above 19.5% IACS (International Annealed Copper Standard), have an elevated temperature strength above 100 ksi at temperatures up to 480° F. (250° C.), and remain ductile (tensile elongation >2%) in their fully age-hardened condition. The alloys may be used in static and moveable electrical contact and probe applications.

11 Claims, 7 Drawing Sheets

(56) References Cited

FOREIGN PATENT DOCUMENTS

JP        2011122194 A  *  6/2011
JP        2012-242184 A    12/2012

OTHER PUBLICATIONS

A. Yu. Volkov, "Improvements to the Microstructure and Physical Properties of Pd—Cu—Ag Alloys", Platinum Metals Rev., 2004, 48, (1), 3-12.
Metals and Materials by R. E. Smallman and R. J. Bishop, published by Butterworth and Heinemann, 1995, pp. 187-188 (Barrett 1952 reference).
E. Raub and G. Worwag, "Die Silber-Palladium-Kupfer Legierungen," Z. Metallkd. 46, 52-57 (1955).
International Search Report and Written Opinion dated May 1, 2017 for International Application No. PCT/US2017015327, 14 pages.
"Volkov, A. Yu "Improvements to the Microstructure and Physical Properties of Pd—Cu—Ag Alloys"", Volkov, A. Yu "Improvements to the Microstructure and Physical Properties of Pd—Cu—Ag Alloys," Platinum Metals Rev., 2004, pp. 3-12, vol. 48 No. 1.
Nielsen, John P. et al. "Grain Size in Cast Gold Alloys." Journal of Dental Research. 1966, vol. 45, No. 3, pp. 964-969.
"Ney Alloys Specifications and Technics: Technical Training with the Added Touch." 1978, 2 pages.

\* cited by examiner

PALLADIUM-BASED ALLOYS

TECHNICAL FIELD

The present disclosure relates to noble metal alloys composition, probes comprising the noble metal alloy compositions and methods of producing such probes.

BACKGROUND

In the field of semiconductor manufacturing there is a continuing demand for smaller device sizes (i.e., higher transistor counts per unit area) and increased processing power (i.e., faster processing speeds).

Because of their desirable resistance to oxidation, the use of precious metal alloys for stationary and moveable or sliding electrical contacts as well as test probes enjoys widespread use for applications such as slip ring brushes, semiconductor probes, potentiometric sensors, etc. For the past 60 years, Paliney™ 7 has been recognized as the benchmark alloy for applications requiring excellent oxidation resistance and formability in its fully age hardened condition. However its electrical conductivity is very low, being only about 5.5% IACS.

U.S. Pat. No. 5,833,774 to Klein et al. discloses compositions of silver/palladium/copper alloys which are used in such applications and describes a range of noble metal alloys, which when heat treated, can offer a range of hardness levels with electrical conductivity in a range of 12-16% IACS. Even though commercial alloys consistent with this teaching (Paliney™ H3C and Paliney™ C) have conductivity values are nearly three times that of Paliney 7 (see Table 2), they still fall short of the desired current-carrying capacity of many new applications. For example, for integrated circuit (IC) test probes with diameters below 100 microns, current levels that can be successfully used remain below 2 Amps because of excessive electrical heating ("New Generation of Probe Alloys", Smith, et. al., IEEE SW Test Workshop, June, 2013). Another shortcoming of alloys within this family is their difficulty in being formed into complex, highly toleranced shapes when in the fully age-hardened condition.

U.S. Pat. No. 6,210,636 to Klein discloses a low cost silver/palladium/copper/nickel/zinc high strength alloy suitable for sliding electrical contact applications. However, because this alloy was developed to reduce its noble metal content and resultant cost by increasing its nickel and zinc content, its oxidation resistance is poor in comparison to alloys having higher noble metal contents. Additionally, for these alloys, the overall conductivity is generally below 10% IACS (Paliney™5, DNI website)

Although alloys in the Pd—Cu—Ag family have been studied since the 1950's (Raub and Worwag, Z. Metallkd., 1955, 46, 52-57), most of the published work has focused on documenting the possible phase relationships and establishing the effect of ordering on the electrical properties of the alloys. As shown in FIGS. 1A and 1B, ordering reactions are known to dramatically reduce the electrical resistivity. FIG. 1A contains the phase diagram for the Cu—Au binary alloys showing the presence of ordered stoichiometric phases, Cu$_3$Au and CuAu. FIG. 1B (Barrett, 1952) illustrates the change in the electrical resistivity of the binary Au—Cu alloys as they are thermally treated to transform from the disordered to the ordered state. In the disordered state (background dotted line), the resistivity is minimized at each of the pure metal states and gradually increases as the two elements are mixed, reaching a maximum near the 50-50 at % level. However, by heat treating the alloys within the appropriate time-temperature regime, it is possible to create an ordered phase and minimize the resistivity at both the 25 at % and 50 at % Au levels. The resistivity values vary in a linearly symmetric fashion as the composition is varied in either direction from the stoichiometric values. This behavior is the generally accepted model for order-disorder transitions.

Palladium/copper alloy systems have also been subjects of technical papers and articles. A. Yu. Volkov, in "Improvements to the Microstructure and Physical Properties of Pd—Cu—Ag Alloys," examined and reported on a range of compositions for the ternary alloy system. Volkov examined the effect of adding silver to a palladium-copper alloy with the primary focus on improving tensile strength. Although this work shows a positive impact on strength, as illustrated in Volkov, all the Ag additions also act to increase the resistivity, e.g., going to a resistivity of roughly 8.5 micro-ohm cm (20.3% IACS) for the Pd—Cu binary alloy going from a resistivity of roughly 11 micro-ohm cm (15.6% IACS) for an alloy with 12 at % Ag. This work does not present any significant understanding regarding how to simultaneously optimize both the mechanical and electrical properties.

Additionally, U.S. Pat. No. 7,354,488 introduces the use of Re in conjunction with other elements such as B, Ni and Ru to increase the strength of high Pd content wrought alloys. In the absence of the synergistic influence of these complementary elements, the data suggests it takes Re levels of at least 10% to reach hardness levels over 300 HK. These alloys typically have very low electrical conductivity values in the 5-8% IACS level. In these systems where the Pd levels are usually above 75 wt %, the Re is thought to be a solid solution strengthening agent and not participate on a second phase or ordering reaction. Re is also occasionally used as a grain refining additive in dental casting alloys, but at very low concentrations, typically below 0.5%.

SUMMARY

According to certain implementations, ternary or higher noble metal alloy comprise palladium, copper, silver and optionally rhenium.

According to certain implementations, a palladium-based ternary or higher alloy includes (a) palladium at about 45-55 wt %; (b) copper at about 32-42 wt %; (c) silver at about 8-15 wt %; (d) rhenium at about 0-5 wt %; and (e) up to 1.0 wt % modifying elements selected from the group consisting of: ruthenium, zirconium, gallium, and zinc. The alloy may have a Pd:Cu ratio of about 1.05 to 1.6 by weight, and a Pd:Ag ratio of about 3 to 6 by weight.

According to certain implementations, the alloy may be provided as or in a probe. According to such implementations, the probe may be configured as a Cobra probe, a cantilever probe, a vertical probe, or a pogo pin probe.

In some implementations and alternatives, the palladium in the alloy is present at about 51-55 wt %, the copper is present at about 32-40 wt %, the silver is present at about 8.5-14 wt %, and the rhenium is present at about 1.1-3 wt %. In some implementations and alternatives, rhenium may be replaced with zinc and may be present at about 0.2-0.7 wt %.

The alloy may have a heat-treated electrical conductivity that exceeds 19.5% IACS; may have a heat-treated hardness of the alloy is at least 350 Knoop; may exhibit a second phase of rhenium; may be free of one or more of: nickel, chromium, gold, platinum and boron, or iron; when age-hardened, may maintain a yield strength above 100 ksi at about 60° F. to about 450° F.; and/or when age-hardened, may have a tensile elongation of greater than 2%.

BRIEF DESCRIPTIONS OF THE DRAWINGS

DETAILED DESCRIPTION

Figure 1A:
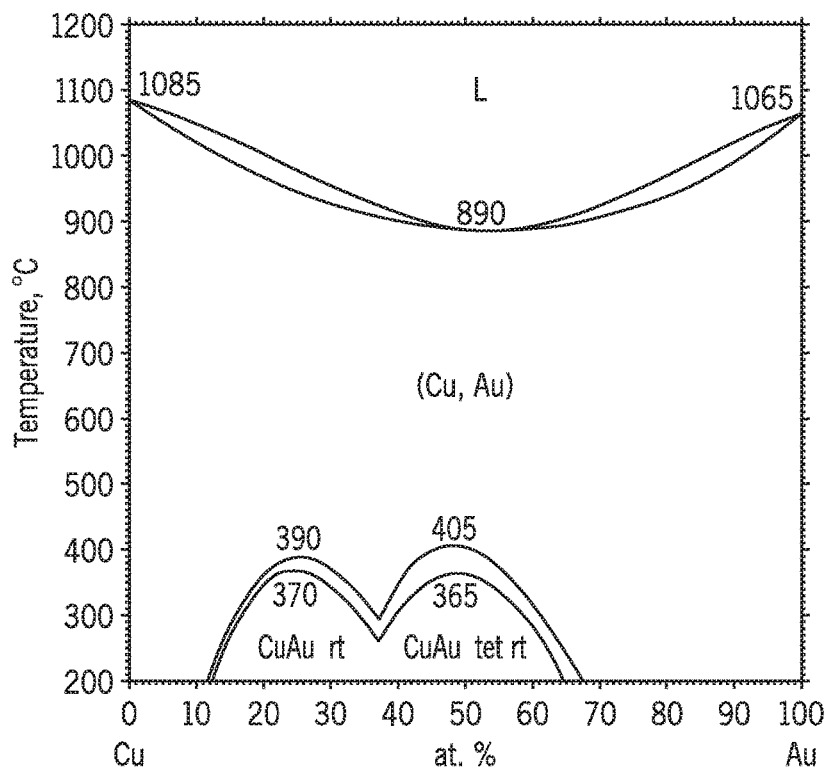
FIG. 1A illustrates a phase diagram for the copper (Cu)-gold (Au) binary alloys showing the presence of ordered stoichiometric phases of $Cu_3Au$ and CuAu.

Overview: In the field of test probes, as device sizes decrease, the discrete space on each device available for being contacted by electrical test probes also decreases. At the same time, the increased processing power requires that the test probes carry higher test currents and thereby accommodate higher test temperatures. The result of these requirements is that: 1) test probe diameters must become smaller to ensure they can accurately be placed on the test pads, 2) the increase in test current coupled with the reduced probe diameter creates the requirement for improved electrical conductivity of the test probe material to avoid the danger of probe overheating and failure, 3) as the test temperatures rise, the alloys must exhibit good strength retention throughout the current rise sequence to avoid premature softening and failure during touch down and wipe, and 4) enhanced ductility is needed to allow extensive forming in the aged condition to ensure the tight dimensional tolerances needed in these miniature components.

Since power dissipation, or heating of the probe, is directly related to its electrical resistance, where:

power dissipated, in Watts=(probe current, in amperes)$^2$×(probe resistance, in Ohms)

it is readily apparent that probe heating is directly proportional to its resistance, and that reducing the test probe's resistance or increasing its electrical conductivity is a critical means to allow the operation of smaller diameter test probes at reasonable temperatures with increased current demands.

Moreover, in addition to lowering the bulk resistance of the probe wire, it is also imperative to maintain a low contact resistance during repeated touchdown of the probe on to the IC surface. This interfacial resistance is controlled by the normal force exerted on the probe at touchdown and the degree of wipe imposed after initial contact. In order to ensure consistent performance, the probe design must ensure that the overall loads remain in the elastic region through the test cycle. Therefore, under increased current density associated with using smaller diameter probes, it is important that the probe wire not exceed its yield strength at elevated temperatures to prevent softening, gram force reduction and eventually premature failure.

Additionally, the alloys must resist any oxidation that could increase probe-device contact resistance. The oxidation resistance of noble metal alloys is well known, while the particular advantages of palladium based noble metal alloys are universally recognized.

In view of these objectives, provided herein are palladium-based alloys which provide electrical conductivity in excess of 19.5% IACS, maintain hardness above 350 $HK_{0.1}$ in order to provide wear resistance, and provide oxidation resistance. The alloys include a yield strength in excess of 100 ksi at temperatures up to 480° F. Sufficient ductility in the fully age-hardened condition enables the palladium-based alloy to be formed into finished test probes or electrical contacts, while eliminating the need for post-forming age hardening, thus avoiding attendant risks of thermal distortion of precision formed shapes during said aging treatment.

Further, and in contrast to prior approaches which do not recognize a correlation between an alloy system's palladium to copper and palladium to silver ratios as they relate to alloy hardenability and electrical conductivity, it has been discovered that a range of an alloy's Pd:Cu ratio achieves both aged hardness and electrical conductivity of a Pd/Cu ternary or higher alloy. In addition, it has been discovered that a range of Pd:Ag ratios in such alloys may further facilitate achieving suitable hardness and conductivity levels.

Figure 1B:
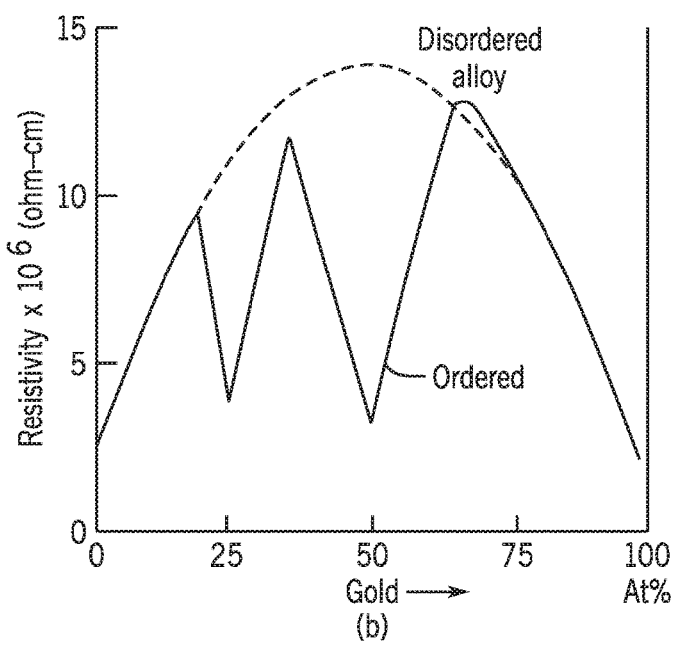
FIG. 1B illustrates the corresponding change in the electrical resistivity of the binary copper-gold alloys as they are thermally treated to transform from the disordered to the ordered state.
Figure 2A:
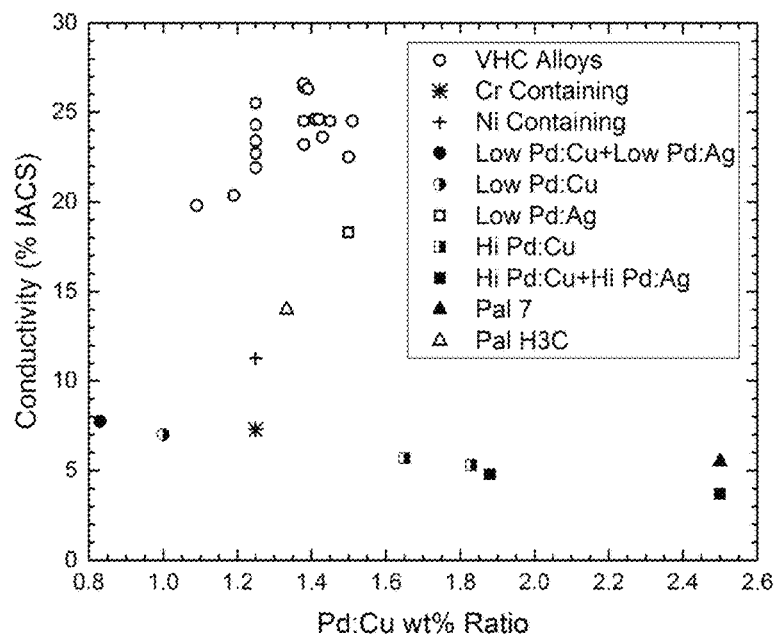
FIG. 2A illustrates a plot of alloy conductivity for palladium-copper-silver alloys at various Pd:Cu ratios.

Accordingly, implementations provide Pd-based alloys having alloying additions of copper and silver with Pd:Cu and Pd:Ag ratios which provide increased electrical conductivity and sufficient hardness to meet the demands required of current test probes. Particularly, we have found that by properly controlling both the Pd:Cu and Pd:Ag ratios, it is possible to create age hardenable Pd alloys that combine high electrical conductivity, high hardness and excellent elevated temperature properties. Although the phase diagram of FIG. 2B suggests there is only a limited range of Pd—Cu alloys that can undergo an ordering reaction, the present disclosure indicates that only a small selection of these alloys are capable of reaching electrical conductivities in excess of 19.5% IACS and often exceeds 25% IACS. For these alloys, the conductivity response appears to be more of a step function rather than the saw tooth response as seen in FIG. 1B. As shown in Table 2 and schematically illustrated in FIG. 2A, the conductivity of the alloys fall dramatically as the Pd:Cu ratio falls outside the ratios of 1.05 to 1.6 by weight. With respect to Table 2, Alloys 1945 and 1932 have Pd:Cu ratios below 1.05 and each has a conductivity below 8% IACS; Alloys 1946, 1924, 1925 and 1926 have Pd:Cu ratios above 1.6 and each has a conductivity below 6%

Figure 2B:
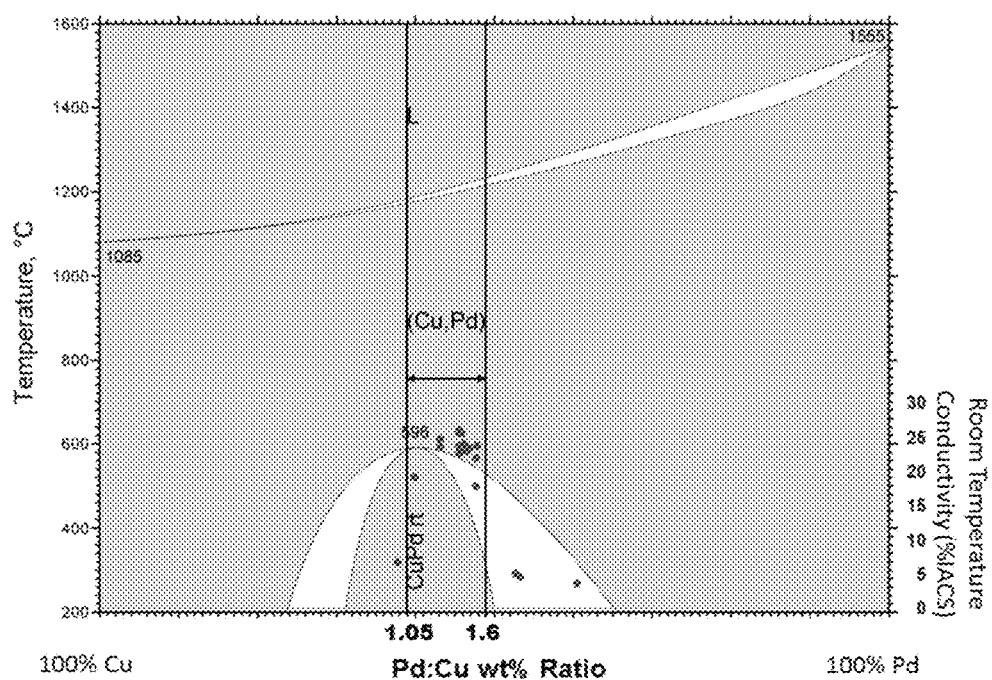
FIG. 2B illustrates a plot of alloy conductivity for palladium-copper-silver alloys at various Pd:Cu ratios superimposed on a binary Cu—Pd phase. The conductivity readings, corresponding to the scale on the right side of the graph, were taken at room temperature.
Figure 2C:
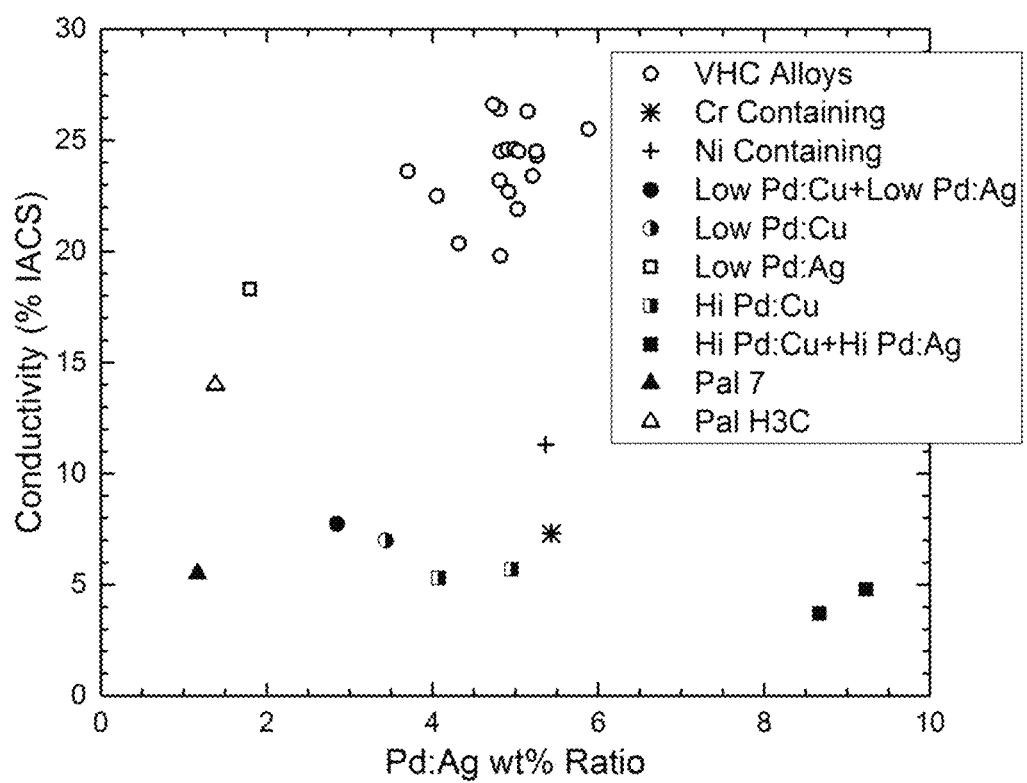
FIG. 2C illustrates a plot of electrical conductivity for heat treated palladium-copper-silver alloys with various Pd:Ag ratios.

IACS. It should also be noted that both Cr and Ni additions also dramatically reduce the conductivity of alloys in this family as illustrated by Alloys 1879 and 1856. In the Figures, the term VHC is used to designate alloy compositions that fall within the scope of this invention. The VHCs identified in FIG. 2A include the alloy compositions listed in Table 1 and include Alloys 1907, 1941, 1910, 1900, 1904, 1859, 1948, 1929, 1933, 1937, 1943, 1930, 1934, 1938, 1935, 1912, 1936, 1931 and 1928. In FIG. 2B, the conductivity data is superimposed over the Pd—Cu phase diagram. This shows that that for these alloys, the symmetry seen in FIG. 1A no longer exists and the high conductivity surprisingly is only maintained within the upper (high Pd) half of the ordered phase field. Within the recommended Pd:Cu ratio the conductivity is generally over 19.5% IACS and often exceeds 25% IACS. However, as shown in FIG. 2C it is also important to maintain the Pd:Ag ratio with a range of 3 to 6 by weight. In FIG. 2C, the VHCs include the alloy compositions listed in Table 1 and listed supra. As shown in Table 2, the conductivity of the alloys fall dramatically as the Pd:Ag ratio falls outside the ratios of 3 to 6 by weight. Alloys 1945 and 1913 have Pd:Ag ratios that fall below 3 and have a conductivity below 19% IACS. Alloys 1925 and 1926 have Pd:Ag ratios that exceed 6 and have a conductivity below 5% IACS. The data clearly shows that to ensure the 19.5% conductivity threshold is always reached, both ratios must be met. Unfortunately, there are very few applications where conductivity alone is sufficient to provide adequate performance. Many applications also require either high hardness or high yield strength levels as the material acts as either a spring member or wear surface.

Figure 3A:
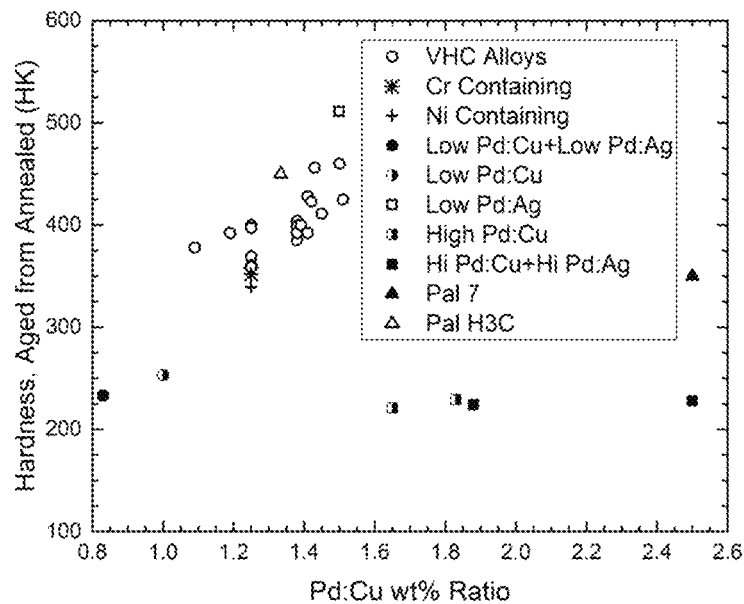
FIG. 3A is a plot of alloy hardness ($HK_{0.1}$) for palladium-copper-silver alloys with various Pd:Cu ratios.
Figure 3B:
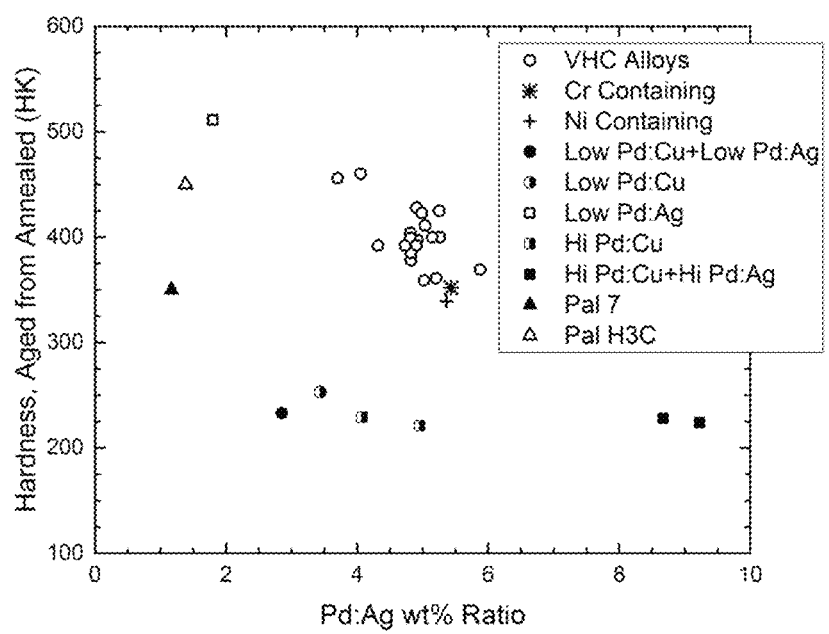
FIG. 3B is a plot of alloy hardness ($HK_{0.1}$) for palladium-copper-silver alloys at various Pd:Ag ratios.

FIGS. 3A and 3B show the alloy hardness in the HT from anneal condition as a function of the Pd:Cu or Pd:Ag ratio, respectively. As with the conductivity, the optimal hardness properties are maintained as long as the Pd:Cu ratio remains in the range of 1.05 to 1.6 (FIG. 3A). However, again, the Pd:Cu ratio alone is insufficient to assure the desired hardness and in this case the Pd:Ag needs to be at or below 6 to ensure minimum the hardness of above 350 HK (FIG. 3B). In Table 2, Alloys 1856, 1945, 1932, 1946, 1924, 1925 and 1926 fall outside of these Pd:Cu and/or Pd:Ag ratios and exhibit a low hardness. Therefore, in order to achieve both the desired hardness and conductivity the ratios of both Pd:Cu and Pd:Ag must be closely controlled.

Alloy Compositions:

The palladium-based alloys of the present disclosure are ternary or higher alloys. Alloying additions may include copper (Cu), silver (Ag) and/or rhenium (Re). Tables 1 and 2 provide alloy compositions, Pd:Cu and Pd:Ag ratios, and alloy properties of exemplary alloys of the present disclosure. These include any, any combination of, or all of Alloys 1907, 1941, 1910, 1900, 1904, 1859, 1948, 1929, 1933, 1937, 1943, 1930, 1934, 1938, 1935, 1912, 1936, 1931 and 1928.

The alloys may include palladium at about 45-55 wt %, about 45-50 wt %, about 47-55 wt %, about 50-55 wt %, about 50-54 wt % or about 51-55 wt %.

Copper may be present in the alloys at about 30-45 wt %, about 30-40 wt %, about 32-40 wt %, about 32-42 wt %, about 35-45 wt %, or about 36-43 wt %.

Silver may be present in the alloys at about 8-25 wt %, about 8-20 wt %, about 8-16 wt %, about 8-15 wt %, about 8-14 wt %, about 8.5-14 wt %, about 8-13 wt %, about 8-12 wt %, about 8-11 wt %, about 9-15 wt %, about 9-14 wt %, about 9-13 wt %, about 9-12 wt %, about 9-11 wt %, or about 8-10 wt %.

Rhenium may be present in the alloys at about 0-5 wt %, about 0.5-5 wt %, about 0.5-4.5 wt %, about 0.5-4 wt %, about 0.5-3.5 wt %, about 0.5-3.0 wt %, about 1.1-3.0 wt %, about 0.5-2.5 wt %, about 0.5-2.0 wt %, or about 0.5-1.5 wt %.

Zinc may be present in the alloys at about 0-3 wt %, about 0.1-1.0 wt %, about 0.2-0.7 wt %, about 0.5-3 wt %, about 1.0-3.0 wt %, or about 0.5-1.5 wt %.

The palladium-based alloys may additionally include up to about 1 percent of modifying elements including ruthenium, zirconium, gallium, and zinc.

The alloys of the present disclosure may consist exclusively of the specifically recited elements, such that the alloys are in a substantially pure form. For instance, where palladium is present in at least 50 wt % of the alloy, palladium makes up the remainder of the recited alloys, to the exclusion of all other (non-recited) substituents. Alternatively, it is to be understood that the presently recited palladium-based alloys may also comprise other substituents as well as those specifically recited, as may advantageously be desired. The recited alloys may also contain various impurities and other small amounts of matter, but in such amounts so as not to effect the advantageous properties of the inventive alloys. Preferably, such trace amounts of material will be present in less than 1000 ppm.

The alloys of the present disclosure may be free of nickel, chromium, gold, platinum, boron, iron, zinc, gallium and bismuth, as well as any other elemental addition. With respect to at least nickel, chromium, gold, platinum, boron, iron, these may be excluded from the disclosed alloys as being harmful to either or both electrical conductivity or aged hardness. For instance, Alloy 1856 is a Pd—Cu—Ag alloy with an alloying addition of Nickel, which results in a significant drop in conductivity (11.3 IACS) and has reduced properties compared to the Pd—Cu—Ag ternary Alloy 1943 (51.5 Pd-37.5 Cu-10.9 Ag). Alloy 1879 is another Pd—Cu—Ag alloy with an alloying addition of Chromium, which also results in a significant drop in conductivity (7.3 IACS) compared to Alloy 1943. Various trace elements may be present due to their unintentional introduction during casting and processing of the alloy as is well known by those skilled in metal casting and processing.

Alloy Ratios and Properties:

A weight ratio of palladium to copper may be at, or about, 1.05 and up to, or up to about, 1.6 by weight. A weight ratio of palladium to silver may be at, or about, 3 and up to, or up to about, 6 by weight.

The alloy in its fully age-hardened condition may have a hardness of at least 350 $HK_{0.1}$, electrical conductivity of at least 19.5% IACS, tensile elongation greater than 2% in 2 inches, elevated temperature yield strength at 480° F. of at least 100 ksi.

Turning to the figures, FIG. 2B illustrates a phase graph for palladium-copper alloys. The graph illustrates Pd:Cu ratios (based on wt %) on the palladium-copper phase diagram (2007 Huang W, Alloy Phase Diagram Database, ASM International) where maximum conductivity, hardness, and elevated temperature strength are attainable. Conductivity tests were conducted at room temperature. The conductivity results overlaying the plot shows high conductivity in the aged condition is restricted to the high Pd half of the ordered phase field and is maximum at a Pd:Cu ratio of about 1.05 to 1.6.

FIG. 3A is a plot of alloy hardness ($HK_{0.1}$) of palladium-copper-silver alloys as a function of Pd:Cu ratio, showing that high hardness (>350 $HK_{0.1}$) is achieved at a Pd:Cu ratio between about 1.05 and 1.6 (based on wt %). FIGS. 1 and 2 illustrate that high hardness and conductivity are achieved at a specific range of Pd:Cu ratios.

FIG. 3B is a plot of alloy hardness ($HK_{0.1}$) for palladium-copper-silver alloys as a function of Pd:Ag ratios, and shows high hardness (>350 $HK_{0.1}$) is achieved at a Pd:Cu ratio between 1.05 and 1.6 (based on wt %) and the Pd:Ag ratio is between 3 and 6. The data illustrate Pd:Cu ratios for alloys that fall outside of the 1.05-1.6 ratio but that have Pd:Ag ratios between 3 and 6, illustrating that the hardness of the alloy is dependent on both the Pd:Cu and the Pd:Ag ratios falling with the specified ranges.

The discovery that, after age hardening, only one section within the ordered region shown on the palladium copper phase diagram with a specific range of Pd:Cu ratios of about 1.05 and 1.6, yielded a combination of both high hardness and exceptionally high conductivity, was unexpected. Generally, it is assumed that for all compositions within the ordered phase field would yield roughly similar hardness.

Figure 4:
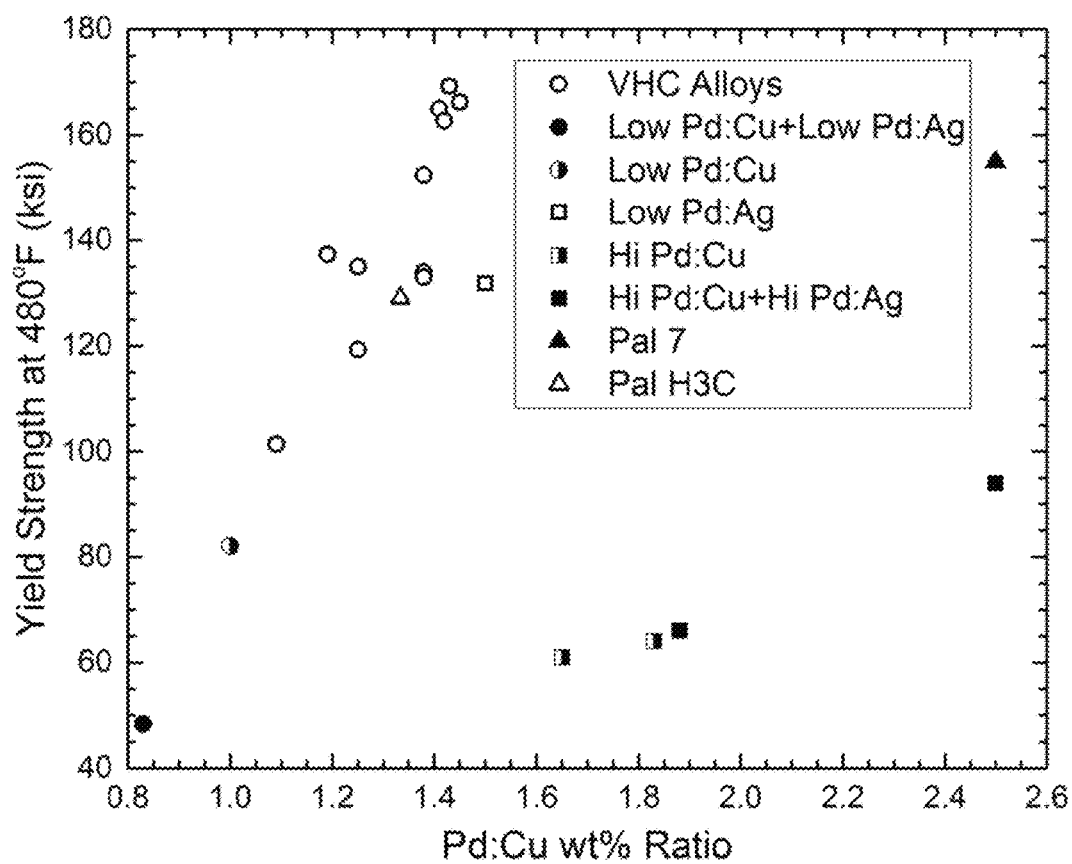
FIG. 4 shows that high elevated temperature, yield strength of alloys is achieved at a specific range of Pd:Cu ratios, similar to those for conductivity and hardness.

FIG. 4 is a graph of elevated temperature (480° F.) yield strength of alloys plotted against Pd:Cu ratio. The results of FIG. 4 show that high strength (>100 ksi) is achieved at a Pd:Cu ratio between about, or between, 1.05 and 1.6 (based on wt %), similar to FIGS. 2A and 3A for conductivity and hardness at room temperatures, e.g., about 60° F., up to about 480° F. Tables 1 and 2 additionally illustrates that, similar to conductivity and hardness, elevated temperature strength was also maximized in a restricted range of the ordered phase field was unexpected.

Figure 5:
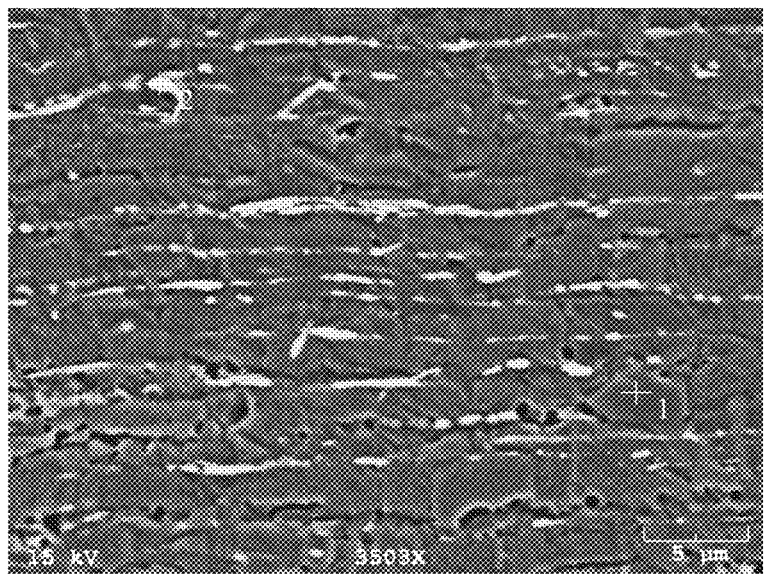
FIG. 5 shows a scanning electron microscope (SEM) micrograph (top) of a palladium-copper-silver-rhenium alloy containing a second phase of rhenium and an energy dispersive spectroscopy (EDS) analysis (bottom) of the matrix (1) and the rhenium rich Lamellae (2).
Figure 7:
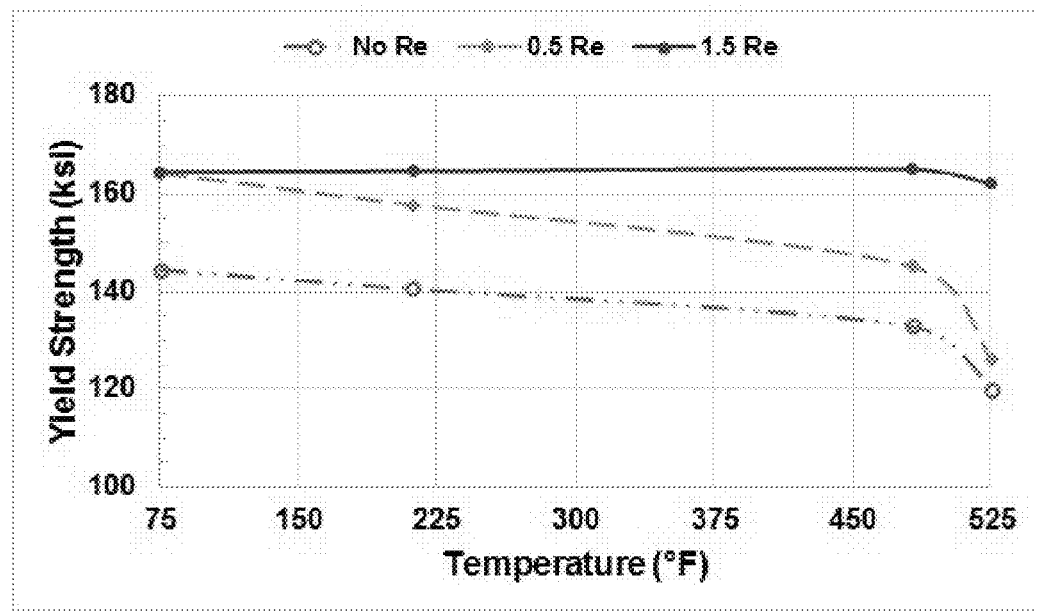
FIG. 7 is a chart illustrating results of yield strength in tensile testing of alloys of the present disclosure at room and elevated temperatures.

FIG. 5 is a scanning electron microscope (SEM) micrograph of a palladium-based alloy showing rhenium-rich lamellae aligned in the drawing direction, and below, an EDS analysis indicating that the lamellae are almost pure rhenium. The presence of a rhenium-rich second phase in the palladium-based alloys in the form of lamellae (aligned in the drawing direction) was also unexpected. At room temperature, rhenium is soluble in Pd but immiscible in both Ag and Cu, meaning the solubility of Re in a ternary matrix is unpredictable. Assuming some Re solubility in the Pd-rich matrix during melting, one would expect the solubility to decrease as the alloy cooled. This would lead to a condition that during either cooling or during the subsequent aging heat treatment, the excess Re would likely precipitate out as small spherical Re rich particles. These particles would likely be coherent precipitates, which are known to cause lattice distortion and result in reduced electrical conductivity. However, with the addition of the correct ratios of copper (Cu) and silver (Ag) to the palladium-based alloy, the much larger rhenium precipitates formed in the alloy matrix are likely incoherent, and have no significant detrimental effect on electrical conductivity. Further, and as shown in FIGS. 7 and 8, the rhenium (Re) additions actually act to improve both the room temperature ductility and high temperature mechanical properties of these alloys. The improved ductility can be further enhanced by selecting an optimal microstructure and heat treatment, discussed below in connection with Alloy 1938.

Figure 6:
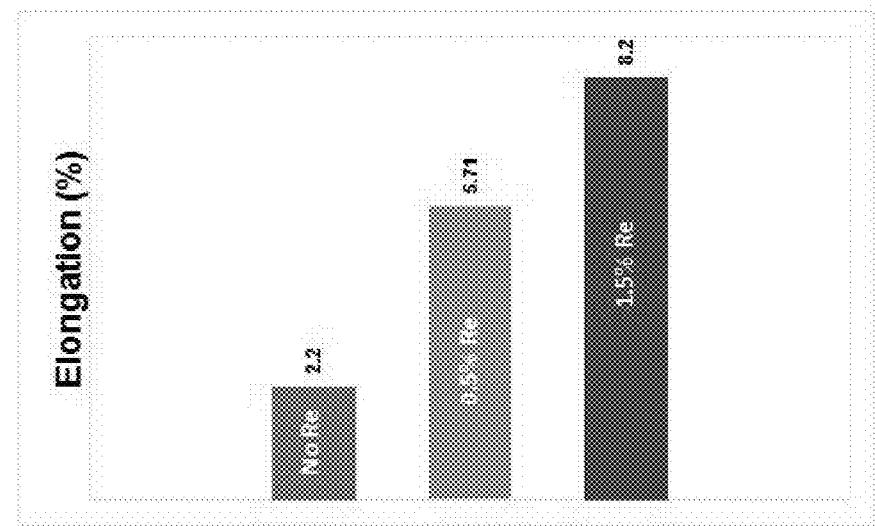
FIG. 6 is a bar chart illustrating results of total elongation in tensile testing of alloys of the present disclosure at room temperature.

Particularly, turning to FIG. 6, a bar chart illustrates results of elongation tensile testing of alloys at room temperature, each containing similar levels of palladium, copper, and silver, with either no additions (control) or with different levels of a rhenium addition. The results of FIG. 6 show that rhenium has a surprising and pronounced improvement on tensile elongation. The results show the palladium-based alloys with an addition of rhenium at 1.5 wt % had a tensile elongation of 8.2%, at 0.5 wt % had a tensile elongation of 5.71%. Each if these is an improvement over alloys containing no rhenium additions, which has a tensile elongation of 2.2%.

FIG. 7 is a chart illustrating results of elongation tensile testing of four alloys under elevated temperatures, each containing similar levels of palladium, copper, and silver with either no additions (control), a rhenium addition, or additions of rhenium of zinc. The results of FIG. 7 show that rhenium has a surprising and pronounced improvement on the retention of yield strength at elevated temperatures.

In terms of the elevated temperature properties of these alloys, the effect of Re is very strong. As a shown in FIG. 7, the Re additions increase the room temperature yield strength (YS) values by nearly 20%. Additionally, the higher Re levels allow the alloy to maintain these higher mechanical properties over a very broad temperature range with virtually no loss in YS from room temperature to nearly 500° F. Without the Re, the Yield Stress is seen to fall by over 20% as the temperature approaches 500° F. While rhenium imparts increased nobility to alloys, our surprising discovery of its presence in the alloy as a distinct second phase that can add additional benefits. It is likely that the rhenium second phase remains plastic during cold working and annealing. This produces a rhenium second phase with a desirable elongated shape in the rolling direction. Because rhenium is a very ductile and malleable element, it is assumed to be desirable for imparting improved forming of fabricated components and improve fatigue strength by arresting fatigue crack growth. The improved formability of the alloy due to rhenium is demonstrated by superior tensile elongation compared to similar alloys that do not contain rhenium, for instance, as illustrated by FIG. 6.

An exemplary palladium-based alloy of the present disclosure (Alloy 1938) includes the following nominal composition:
palladium 51.5 wt %,
copper 36.5 wt %,
silver 10.5 wt %,
and rhenium 1.5 wt %.
Based on the composition of the alloy, the palladium to copper and palladium to silver ratios are: Pd:Cu ratio 1.41 by weight, and Pd:Ag ratio 4.9 by weight.

Alloy 1938 has a ductility that enables it to be fabricated into fine wire, with diameters below 0.004 in., using normal in-process anneals and drawn on conventional wire processing equipment. Final annealing of this wire by strand annealing at 900° C. (followed by an immediate water quench) softened the alloy and put it into a disordered condition, which is requisite for subsequent artificial age hardening. It was age hardened by heating it to 710° F. and holding it at that temperature for 90 min. Cooling to room temperature is not rate sensitive and took 1-2 hours. A protective atmosphere was maintained during all thermal treatments. After such annealing and aging heat treatments, the tensile and electrical properties of the 0.004 in. diameter wire fabricated from the alloy were:

| Hardness (HK) | Electrical Conductivity (% IACS) | UTS (ksi) | 0.2% Y.S. (ksi) | Elongation (% in 2 in.) | Modulus (ksi × $10^6$ psi) |
| --- | --- | --- | --- | --- | --- |
| 451 | 27.96 | 191 | 148 | 13.3 | 18.7 |

The addition of rhenium with heat treatment further enhances ductility and can provide a microstructure suitable for probe tips used in electrical testing. For example, the table below illustrates the effects of initial cold work and heat treat temperature on the mechanical properties and conductivity for Alloy 1938.

| Condition | HT conditions | Hardness (Hk) | UTS (ksi) | 0.2% YS (ksi) | Elongation % | Conductivity (% IACS) |
|---|---|---|---|---|---|---|
| | Mechanical Properties of Alloy 1938 after Initial Cold Work and Heat Treatment of .004" dia. wire | | | | | |
| Annealed | | 227 | 110.1 | 83.9 | 24.2 | 5.8 |
| HT from anneal | 710 F., 90 min | 412 | 181.2 | 157.3 | 6.49 | 24.9 |
| HT from anneal | 650 F., 6 hr | 425 | 191.9 | 162.1 | 7.46 | 25.6 |
| Cold Worked | | 339 | 196.9 | 156.1 | 2.17 | 6.1 |
| HT from CW | 710 F., 90 min | 441 | 210.8 | 156.1 | 12.9 | 26.2 |
| HT from CW | 650 F., 6 hr | 449 | 217.2 | 198.1 | 13.1 | 26.9 |

Table 1 lists the nominal alloy compositions, Pd:Cu and Pd:Ag ratios of exemplary palladium-based alloys of the present disclosure, while other alloy compositions and ratios are provided for purposes of distinction from the palladium-based alloys of Applicant's invention. Table 2 lists the conductivity, hardness, yield strength, and tensile elongation values of these various alloys.

TABLE 1

| Alloy Code | Pd (wt %) | Cu (wt %) | Ag (wt %) | Re (wt %) | Other (wt %) | Pd:Cu | Pd:Ag | |
|---|---|---|---|---|---|---|---|---|
| | | | Alloy compositions and elemental ratios (by weight) | | | | | |
| 1907 | 47 | 43 | 9.75 | | 0.25 Ga | 1.09 | 4.82 | |
| 1941 | 47.5 | 40 | 11 | 1.5 | | 1.19 | 4.32 | |
| 1910 | 50 | 40 | 8.5 | 1.5 | | 1.25 | 5.88 | |
| 1900 | 50 | 40 | 9.5 | | 0.5 Zr | 1.25 | 5.26 | |
| 1904 | 50 | 40 | 9.6 | | 0.25 Ga 0.15 Zr | 1.25 | 5.21 | |
| 1859 | 50 | 40 | 9.95 | | .05B | 1.25 | 5.03 | |
| 1948 | 49.2 | 39.3 | 10 | 1.5 | | 1.25 | 4.92 | |
| 1929 | 51.4 | 37.3 | 10.65 | | 0.5 Zn 0.15 Ga | 1.38 | 4.83 | |
| 1933 | 51.5 | 37.3 | 10.7 | | 0.5 Zn | 1.38 | 4.81 | |
| 1937 | 51.5 | 37.3 | 10.7 | 0.5 | | 1.38 | 4.81 | |
| 1943 | 51.6 | 37.5 | 10.9 | | | 1.38 | 4.73 | |
| 1930 | 51.5 | 37 | 10 | 1.5 | | 1.39 | 5.15 | |
| 1934 | 51.5 | 36.5 | 10.5 | | 1.5 Zn | 1.41 | 4.9 | |
| 1938 | 51.5 | 36.5 | 10.5 | 1.5 | | 1.41 | 4.9 | |
| 1935 | 51.4 | 36.3 | 10.3 | 1.5 | 0.5 Zn | 1.42 | 4.99 | |
| 1912 | 50 | 35 | 13.5 | 1.5 | | 1.43 | 3.7 | |
| 1936 | 51.4 | 35.4 | 10.2 | 1.5 | 1.5 Zn | 1.45 | 5.04 | |
| 1931 | 51.5 | 34.3 | 12.7 | 1.5 | | 1.5 | 4.06 | |
| 1928 | 51.5 | 34.2 | 9.8 | 4.5 | | 1.51 | 5.26 | |
| | | | Reduced Properties | | | | | |
| 1879 | 50 | 40 | 9.2 | | .8 Cr | 1.25 | 5.44 | Cr containing |
| 1856 | 50 | 40 | 9.32 | | .68Ni | 1.25 | 5.36 | Ni containing |
| 1945 | 38.5 | 46.5 | 13.5 | 1.5 | | 0.83 | 2.85 | Low Pd:Cu + Low Pd:Ag |
| 1932 | 43 | 43 | 12.5 | 1.5 | | 1 | 3.44 | Low Pd:Cu |
| 1913 | 45 | 30 | 25 | | | 1.5 | 1.8 | Low Pd:Ag |
| 1946 | 54.5 | 33 | 11 | 1.5 | | 1.65 | 4.95 | Hi Pd:Cu |
| 1924 | 55 | 30 | 13.5 | 1.5 | | 1.83 | 4.07 | Hi Pd:Cu |
| 1925 | 60 | 32 | 6.5 | 1.5 | | 1.88 | 9.23 | Hi Pd:Cu + Hi Pd:Ag |
| 1926 | 65 | 26 | 7.5 | 1.5 | | 2.5 | 8.67 | Hi Pd:Cu + Hi Pd:Ag |
| Paliney 7 | 35 | 14 | 30 | | Au = 10 Pt = 10 Zn = 1 | 2.5 | 1.17 | Hi Pd:Cu + Low Pd:Ag |
| H3C | 40 | 29.9 | 29 | | Zn = 1 B = .1 | 1.34 | 1.38 | Low Pd:Ag |

TABLE 2

Alloy compositions, elemental ratios (by weight), and key properties (conductivity, hardness, room and elevated temperature yield strengths, and room temperature tensile elongation) (Heat treat conditions 60 to 90 minutes at 710° F.)

| Alloy Code | Pd:Cu | Pd:Ag | Cond in. Ann/Age (% IACS) | Hardness in. Ann/Age (Hk) | YS @RT (ksi) | YS @480° F. (ksi) | % El (RT) Ann/Age | |
|---|---|---|---|---|---|---|---|---|
| 1907 | 1.09 | 4.82 | 19.8 | 378 | 132 | 101 | 2.1 | |
| 1941 | 1.19 | 4.32 | 20.4 | 392 | 165 | 137 | 4.5 | |
| 1910 | 1.25 | 5.88 | 25.5 | 369 | 117 | 119 | 24.4 | |
| 1900 | 1.25 | 5.26 | 24.3 | 400 | | | | |
| 1904 | 1.25 | 5.21 | 23.4 | 361 | | | | |
| 1859 | 1.25 | 5.03 | 21.9 | 359 | | | | |
| 1948 | 1.25 | 4.92 | 22.7 | 397 | 139 | 135 | 9.8 | |
| 1929 | 1.38 | 4.83 | 24.5 | 385 | 156 | | 4.4 | |
| 1933 | 1.38 | 4.81 | 26.4 | 404 | 140 | 134 | 3.2 | |
| 1937 | 1.38 | 4.81 | 23.2 | 399 | 164 | 152 | 5.7 | |
| 1943 | 1.38 | 4.73 | 26.6 | 392 | 142 | 133 | 2.2 | |
| 1930 | 1.39 | 5.15 | 26.3 | 400 | 146 | | 4.0 | |
| 1934 | 1.41 | 4.9 | 24.6 | 392 | 163 | | 4.2 | |
| 1938 | 1.41 | 4.9 | 24.6 | 428 | 165 | 165 | 8.2 | |
| 1935 | 1.42 | 4.99 | 24.6 | 423 | 161 | 163 | 6.0 | |
| 1912 | 1.43 | 3.7 | 23.6 | 456 | 198 | 169 | 5.3 | |
| 1936 | 1.45 | 5.04 | 24.5 | 411 | 166 | 166 | 3.2 | |
| 1931 | 1.5 | 4.06 | 22.5 | 460 | 193 | | 3.2 | |
| 1928 | 1.51 | 5.26 | 24.5 | 425 | 170 | | 4.6 | |
| Reduced Properties | | | | | | | | |
| 1879 | 1.25 | 5.43 | 7.3 | 352 | | | | Low conductivity |
| 1856 | 1.25 | 5.36 | 11.3 | 339 | | | | Low Cond/Hard |
| 1945 | 0.83 | 2.85 | 7.7 | 310 | 113 | 48 | 15.0 | Low Cond/Hard |
| 1932 | 1 | 3.44 | 7.0 | 253 | 95 | 82 | 17.9 | Low Cond/Hard |
| 1913 | 1.5 | 1.8 | 18.3 | 511 | 160 | 132 | 0.9 | Low Cond/elong |
| 1946 | 1.65 | 4.95 | 5.7 | 221 | 83 | 61 | 23.2 | Low conductivity |
| 1924 | 1.83 | 4.07 | 5.3 | 229 | 93 | 64 | 16.0 | |
| 1925 | 1.88 | 9.23 | 4.8 | 224 | 88 | 66 | 18.6 | and Low Hardness And Low Strength |
| 1926 | 2.5 | 8.67 | 3.7 | 228 | 94 | 94 | 21.4 | |
| Paliney 7 | 2.5 | 1.17 | 5.5 | 350 | 183 | 155 | 2.2 | |
| H3C | 1.34 | 1.38 | 14.0 | 450 | 256 | 129 | 2.5 | |

Exemplary uses for the alloys of the present disclosure are in the fields of electrical testing and medical devices. With respect to electrical testing, the alloys may be used in static and moveable electrical contact and probe applications. For instance, the alloys may be included as a component of a probe, a slip ring assembly (either as the ring or brush), or sliding contacts in applications such as a potentiometric sensor. Probes may include electrical probes used in connection with semiconductor testing. Semiconductor test probes may be formed as the alloys of the present disclosure, or the alloys may form a portion of the probe and a probe tip may be coupled thereto. The test probes may be configured as Cobra probes, cantilever probes, pogo pin probes and vertical probes.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A palladium-based ternary or higher alloy, consisting of:
   (a) palladium at about 45-55 wt %;
   (b) copper at about 32-42 wt %;
   (C) silver at about 8-15 wt %;
   (d) rhenium at about 1.5-5 wt %;
   (e) up to 1.0 wt % modifying elements selected from the group consisting of: ruthenium, zirconium, gallium, and zinc; and
   (f) optionally, one or more impurities,
   wherein the alloy exhibits a second phase of rhenium,
   wherein the alloy has a Pd:Cu ratio of about 1.05 to 1.6 by weight,
   wherein the alloy has a Pd:Ag ratio of about 3 to 6 by weight, and
   wherein a heat-treated electrical conductivity of the alloy exceeds 19.5% IACS.

2. The alloy of claim 1, wherein the palladium is present at about 51-55 wt %, the copper is present at about 32-40 wt %, the silver is present at about 8.5-14 wt %, and the rhenium is present at about 1.5-2.5 wt %.

3. The alloy of claim 1, wherein the palladium is present at about 51-55 wt %, the copper is present at about 32-40 wt %, the silver is present at about 8.5-14 wt %, and zinc is present at about 0.2-0.8 wt %.

4. The alloy of claim 1, wherein a hardness of the heat treated alloy is at least 350 Knoop.

5. The alloy of claim 1, wherein the alloy is age-hardened and maintains a yield strength above 100 ksi at about 60° F. to about 480° F.

6. The alloy of claim 1, wherein the alloy is age-hardened and has a tensile elongation of greater than 2%.

7. A semiconductor probe comprising a palladium-based ternary or higher alloy, the ahoy consisting of:
   (a) palladium at about 45-55 wt %;
   (b) copper at about 32-42 wt %;
   (c) silver at about 8-15 wt %;
   (d) rhenium at about 1.5-5 wt %;
   (e) up to 1.0 wt % modifying elements selected from the group consisting of: ruthenium, zirconium, gallium, and zinc; and
   (f) optionally, one or more impurities,
   wherein the ahoy exhibits a second phase of rhenium,
   wherein the ahoy has a Pd:Cu ratio of about 1.05 to 1.6 by weight,
   wherein the ahoy has a Pd:Ag ratio of about 3 to 6 by weight, and
   wherein a heat-treated electrical conductivity of the alloy exceeds 19.5% IACS.

8. The semiconductor probe of claim 7, wherein the probe configured as a Cobra probe, a cantilever probe, a vertical probe, or a pogo pin probe.

9. The semiconductor probe of claim 7, wherein a hardness of the heat treated alloy is at least 350 Knoop.

10. The semiconductor probe of claim 7, wherein the alloy is age-hardened and maintains a yield strength above 100 ksi at about 60° F. to about 480° F.

11. The semiconductor probe of claim 7, wherein the alloy is age-hardened and has a tensile elongation of greater than 2%.

* * * * *

UNITED STATES PATENT AND TRADEMARK OFFICE
CERTIFICATE OF CORRECTION

PATENT NO.        : 10,385,424 B2                               Page 1 of 1
APPLICATION NO.   : 15/010690
DATED             : August 20, 2019
INVENTOR(S)       : Arthur S. Klein et al.

It is certified that error appears in the above-identified patent and that said Letters Patent is hereby corrected as shown below:

In the Claims

| Column | Line | Claim | | Should Be |
|---|---|---|---|---|
| 13 | 16 | 7 | "the ahoy consisting of" | -- the alloy consisting of -- |
| 14 | 5 | 7 | "the ahoy exhibits a" | -- the alloy exhibits a -- |
| 14 | 6 | 7 | "the ahoy has a Pd:Cu ratio" | -- the alloy has a Pd:Cu ratio -- |
| 14 | 8 | 7 | "the ahoy has a Pd:Au ratio" | -- the alloy has a Pd:Au ratio -- |

Signed and Sealed this
Third Day of December, 2019

Andrei Iancu
*Director of the United States Patent and Trademark Office*